United States Patent [19]

Ando et al.

[11] Patent Number: 5,012,105
[45] Date of Patent: Apr. 30, 1991

[54] MULTIPLE-IMAGING CHARGED PARTICLE-BEAM EXPOSURE SYSTEM

[75] Inventors: Masaaki Ando; Masaaki Matsuzaka, both of Fujisawa; Masahiro Saita, Zushi, all of Japan

[73] Assignee: Nippon Seiko Kabushiki Kaisha, Tokyo, Japan

[21] Appl. No.: 471,280

[22] Filed: Jan. 26, 1990

[30] Foreign Application Priority Data

Feb. 2, 1989 [JP] Japan ............................ 1-24506
Feb. 2, 1989 [JP] Japan ............................ 1-24507
Feb. 2, 1989 [JP] Japan ............................ 1-24508

[51] Int. Cl.⁵ ............................................. H01J 37/00
[52] U.S. Cl. ................................. 250/398; 250/492.2
[58] Field of Search ........... 250/398, 396 R, 396 ML, 250/492.21, 492.22, 492.2

[56] References Cited

U.S. PATENT DOCUMENTS

| | | | |
|---|---|---|---|
| 4,430,571 | 2/1984 | Smith et al. | 250/492.2 |
| 4,465,934 | 8/1984 | Westerberg et al. | 250/398 |
| 4,524,278 | 6/1985 | Le Poole | 250/398 |
| 4,710,632 | 12/1987 | Ishitani et al. | 250/492.2 |

OTHER PUBLICATIONS

I. Brodie et al, "A Multiple-Electron-Beam Exposure System for High-Throughput, Direct-Write Submicrometer Lithography", IEEE Transactions on Electron Devices, vol. Ed-28, No. 11, Nov. 1981-pp. 1422-1428.

*Primary Examiner*—Jack I. Berman
*Assistant Examiner*—Kiet T. Nguyen
*Attorney, Agent, or Firm*—Frishauf, Holtz, Goodman & Woodward

[57] ABSTRACT

A multiple-imaging charged particle-beam exposure system includes a charged particle beam source, and a screen lens having lens apertures therein. A charged particle beam is emitted from the charged particle beam source. A beam emerging from each of the lens apertures of the screen lens is irradiated on an object to be exposed, to effect exposure on the object. An image forming electrode is interposed between the screen lens and the object for focusing beams emerging from the screen lens to form images at the image forming electrode. An acceleration/deceleration correcting lens is interposed between the image forming electrode and the object for limiting divergency of the images formed at the image forming electrode. A bias voltage controller applies a bias voltage relative to a potential at the image forming electrode to a surface of the object. Alternatively, a beam limiting aperture plate having beam limiting apertures therein is interposed between the charged particle beam source and the screen lens. A deflector, is interposed between the beam limiting aperture plate and the screen lens, individually deflects charged particle beams emerging from the beam limiting apertures. Alternatively, a limiting aperture shapes the charged particle beam emitted from the charged particle beam source. A drawing electrode takes out the charged particle beam via the limiting aperture, and a deflector deflects the charged particle beam. An Einzel lens is interposed between the drawing electrode and the deflector.

13 Claims, 12 Drawing Sheets

MULTIPLE-IMAGING CHARGED PARTICLE-BEAM EXPOSURE SYSTEM

BACKGROUND OF THE INVENTION

This invention relates to an imaging charged particle beam exposure system employed for writing fine patterns on wafers or mask substrates in the process of manufacturing integrated circuit devices, ion implantation, vacuum vapor deposition, etc., and more particularly to a multiple-imaging charged particle-beam exposure system, which is capable of writing identical patterns on a lot of chips at the same time.

Imaging charged particle beam pattern writing methods using a single scanning-electron beam have conventionally been employed to directly write patterns on wafers for integrated circuit devices. However, the methods suffer from low productivity. To overcome this disadvantage, a multiple-electron-beam exposure system has been proposed, which uses a plurality of charged particle beams to write identical patterns on a plurality of chips at the same time to thereby improve the productivity, for example, by IEEE TRANSACTIONS ON ELECTRON DEVICES, VOL. ED-28, No. 11, Nov. 1981, pp 1422–1428.

FIG. 1 shows the construction of this conventional multiple-imaging charged particle-beam exposure system. A charged particle beam 108 is emitted from a beam source 101 via an Einzel lens 102, a blanker 103, and an object aperture 104, and deflected by a deflector 105 to uniformly flood a screen lens 106 so that a charged particle beam emerging from each of lens apertures of the screen lens 106 forms an image of the object aperture on an object (e.g. wafer) 107 under each lens aperture. In FIG. 1, Zo is a distance (hereinafter referred to as "the first distance") between the object aperture 104 and the screen lens 106, Zi a distance (hereinafter referred to as "the second distance") between the screen lens 106 and the object 107 to be exposed, $V_1$ a voltage (hereinafter referred to as "the first voltage") between the beam source 101 and the screen lens 106, and $V_2$ a voltage (hereinafter referred to as "the second voltage") between the beam source and the object 107.

The first distance Zo and the second distance Zi are set at approximately 1,000 mm and 20 mm, respectively. In such an arrangement, in order to focus charged particle beams on the object 107, the second voltage $V_2$ should be approximately nine times as high as the first voltage $V_1$ ($V_2 = 9 V_1$). In the meanwhile, the first voltage $V_1$ has to be set within a small range limited by the capacity of the beam source and the required current density (energy of the beam), and is set to 1 KV, for example. The second voltage $V_2$ is, therefore, necessarily set to approximately 9 KV. Therefore, the conventional system is not suitable for an application other than the pattern writing, for example, ion implantation which requires high imaging charged particle beam energy and vacuum deposition which uses imaging charged particle beam having relatively low energy, if a single such system is used, because in the case of ion implantation the second voltage $V_2$ has to be set to 100 KV whereas in the case of vacuum deposition it has to be set to 1 KV. In order to avoid this inconvenience, a method has conventionally been used, which employs an electrode for acceleration and deceleration of charged particle beams, which is arranged immediately before the object. However, the second distance Zi cannot be set to a large distance due to restrictions imposed by the required magnification (Zi/2Zo) of an image to be formed on the object 107 and the size of the system (Zi is usually approximately 20 mm). Therefore, it is difficult to simply arrange the electrode for acceleration and deceleration of beam between the screen lens 106 and the object 107.

Further, the conventional exposure system also suffers from the following problem: As shown in FIG. 2, when beams emerging from lens apertures 106a of the screen lens 106 are focused on the wafer 107, beams from lens apertures 106b, 106c in the peripheral portion of the screen lens 106 are focused before they reach the wafer 107 to form obscure images on the peripheral portion of the wafer 107. Therefore, the number of lens apertures in the screen lens 106, i.e. the number of chips to be exposed at the same time must be reduced to a range within which all the chips have clear images formed thereon.

In order to solve this problem of obscurity of images, the following exposure systems have conventionally been proposed:

(1) An exposure system, in which, as shown in FIG. 3, the screen lens 106 is curved such that the beams emerging from lens apertures 106b, 106c in the peripheral portion of the screen lens 106 are focused on the wafer 107 (Japanese Provisional Patent Publication (Kokai) No. 62-76619).

(2) An exposure system, in which a deflector is provided between the screen lens 106 and the wafer 107 to deflect beams emerging from the screen lens 106 (Japanese Provisional Patent Publication (Kokai) No. 60-173834).

In the exposure system (1), the screen lens 106 must be precisely curved in accordance with the distance between the screen lens 106 and the object aperture 104, the diameter of lens apertures, etc., which requires strict tolerances of the curvature of the screen leans. Further, since focal locations where images are formed by individual beams from the lens apertures are not each corrected, it is impossible to correct deviations of relative position between chips due to global alignment, thermal strain and machining strain produced in devices in the course of manufacture thereof, etc.

In the exposure system (2), the deflector provided between the screen lens and the wafer can disturb the magnetic field therebetween, so that the beams do not form clear images on the wafer, which results in degraded resolution.

Further, in the exposure system of FIG. 1, the Einzel lens 102 converges the beam 108 so as to pass through the object apeture 104. However, as shown in FIG. 4, part of the beam is irradiated on the perimeter (hatched part in FIG. 4) of the object aperture 104 of the object aperture plate 104'. This can cause sputtering damage to the object aperture plate 104' (formed, e.g., of molybdenum and tungsten) and hence prevents long-time continuous operation of the system.

Further, part of the beam is intercepted by the object aperture plate 104' to such a degree as to lose 40% of the energy of the beam in passing through the object aperture, so that the beam current density on the object is decreased, limiting the exposure region thereof that can be effectively exposed.

SUMMARY OF THE INVENTION

It is a first object of the invention to provide a multiple-imaging charged particle-beam exposure system which can be applied not only to pattern writing but also to ion implantation as well as vapor deposition.

It is a second object of the invention to provide a multiple-imaging charged particle-beam exposure system which can improve the pattern writing precision by properly correcting the focal locations of individual multiple-imaging charged particle-beams where images are formed, independently of each other, to thereby increase the production yield of chips.

It is a third object of the invention to provide a multiple-charged particle-beam exposure system which can afford continuous operation over a long period of time, and can secure a wider pattern writing region.

To attain the above objects, according to a first aspect of the invention, there is provided a multiple-imaging charged particle-beam exposure system including a charged particle beam source, and a screen lens having a number of lens apertures formed therethrough, wherein a charged particle beam is emitted from the charged particle beam source so that a beam emerging from each of the lens apertures of the screen lens is irradiated on an object to be exposed, to effect exposure on the object.

The system according to the first aspect of the invention is characterized by comprising:

image forming means interposed between the screen lens and the object for focusing ion beams emerging from the screen lens to form images at the image forming means;

acceleration/deceleration correcting means interposed between the image forming means and the object for controlling divergency of the images formed at the image forming means by correcting acceleration or deceleration of ion beams emerging from the image forming means; and bias voltage control means for applying a bias voltage relative to a potential at the image forming means to a surface of the object.

Preferably, the image forming means comprises an electrode which has apertures formed therethrough at locations corresponding respectively to the lens apertures of the screen lens, the apertures of the electrode each having a diameter smaller than that of the lens apertures of the screen lens, a negative voltage relative to the potential of the screen lens being applied to the electrode.

More preferably, the acceleration/deceleration correcting means comprises a lens to which is applied a voltage calculated based on a distance between the image forming means and the object, and the bias voltage.

According to a second aspect of the invention, there is provided a multiple-imaging charged particle-beam exposure system which is characterized by comprising:

beam limiting means interposed between the charged particle beam source and the screen lens, the beam limiting means having a plurality of beam limiting apertures formed therethrough; and deflector means interposed between the beam limiting means and the screen lens for individually deflecting a plurality of charged particle beams emerging from the beam limiting apertures.

Preferably, the deflector means deflects the charged particle beams in two directions orthogonal to each other.

More preferably, the deflector means comprises two pairs of electrodes arranged at a location corresponding to each of the lens apertures of the screen lens, voltages being applied to the two pairs of electrodes, the voltage being controlled independently of each other.

According to a third aspect of the invention, there is provided a multiple-imaging charged particle-beam exposure system which is characterized by comprising:

a member having a limiting aperture for shaping the charged particle beam emitted from the charged particle beam source;

a drawing electrode for taking out the charged particle beam via the member having the limiting aperture;

a deflector for deflecting the charged particle beam; and an Einzel lens interposed between the drawing electrode and the deflector.

Preferably, the Einzel lens comprises an upper electrode located on a beam-receiving side thereof, a lower electrode located on a beam-emitting side thereof, and an intermediate electrode interposed between the upper electrode and the lower electrode, the upper electrode and the lower electrode having the same electric potential, the intermediate electrode having a potential adjustable for controlling divergency of the charged particle beam passing therethrough.

More preferably the potential of the intermediate electrode is set to a value higher than the potential of the upper and lower electrodes.

The above and other objects, features, and advantages of the invention will become more apparent from the ensuing detailed description taken in conjuntion with the accompanying drawings.

DETAILED DESCRIPTION

The invention will now be described in detail with reference to the drawings showing embodiments thereof.

Figure 5:
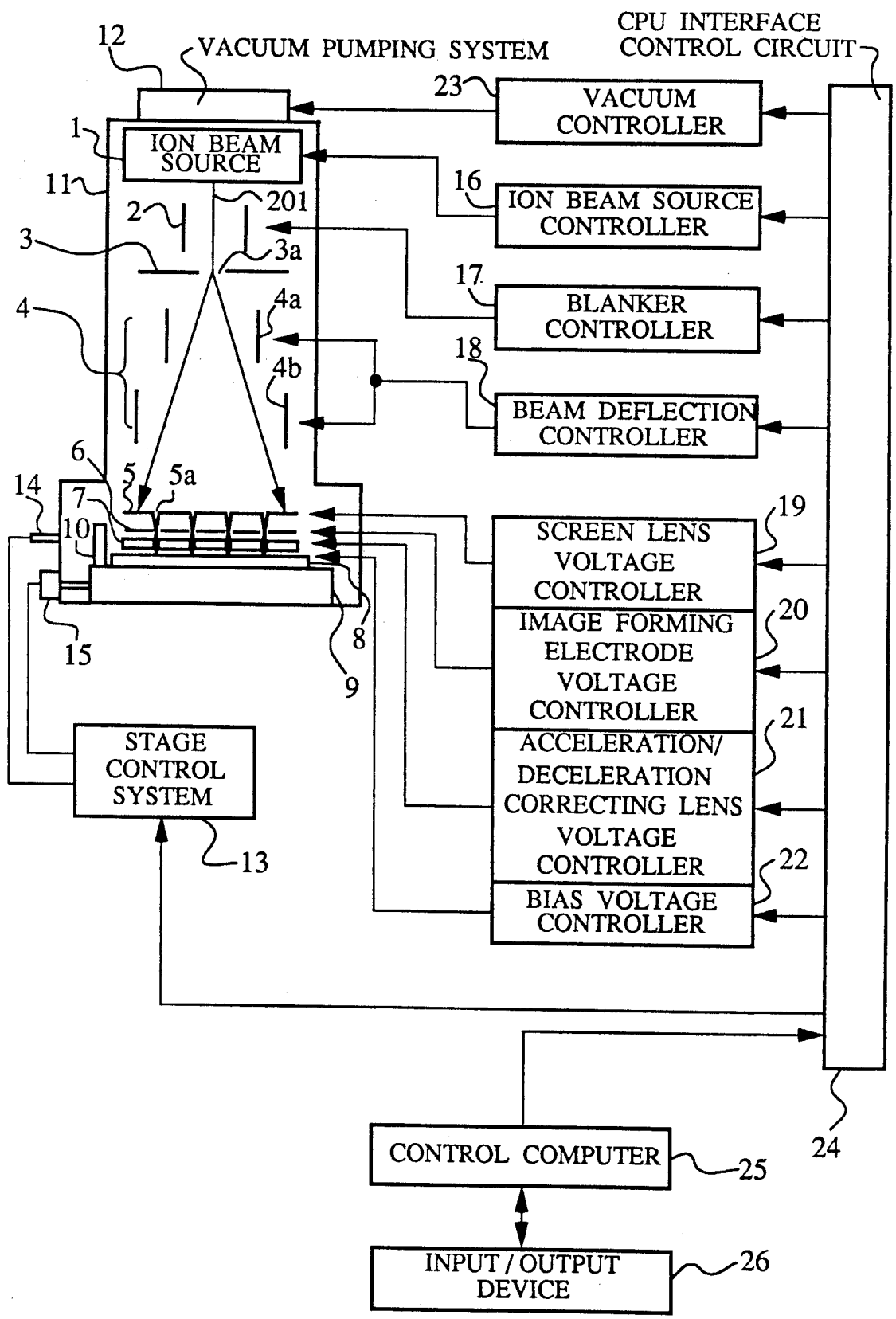
FIG. 5 is a schematic diagram showing the arrangement of a multiple-imaging charged particle-beam exposure system according to a first embodiment of the invention.

FIG. 5 shows the arrangement of a multiple-imaging charged particle-beam exposure system according to a first embodiment of the invention. In the figure, reference numeral 1 indicates an ion beam source 1 for generating an ion beam 201 as charged particle beam, and below the ion beam source 1, there are arranged a blanker 2, an object aperture 3a, two pairs of deflectors 4, a screen lens 5, an image forming electrode (image forming means) 6, and acceleration/deceleration correcting lens (acceleration/deceleration correcting means) 7, in the mentioned order.

The ion beam 201 emitted from the ion beam source 1 travels through the blanker 2, and the object aperture 3a, and is deflected by the deflector 4 so that an ion beam emerging from each of lens apertures 5a of the screen lens 5 forms an image on a workpiece (an object to be exposed, e.g. a silicon wafer) 8 on an X-Y stage 9 under each lens aperture via the image forming electrode 6, and the acceleration/deceleration correcting lens 7, to thereby effect pattern writing, ion implantation, or vapor deposition to the workpiece 8.

The ion beam source 1 is composed of an ion source, a condenser lens, etc., and in this embodiment, produces positive ions. The blanker 2 is a kind of a deflector, and deflects, as required, the ion beam 201 to cause same to be intercepted by an object aperture plate 3. Thus the ion beam is selectively irradiated on the workpiece 8 and intercepted by the blanker 2. The object aperture 3a shapes the cross-section of the ion beam 201 so that images having the shape of the cross-section are formed on the workpiece 8. The deflectors 4 are composed of a first deflector 4a and a second deflector 4b, and adjusts the size of a region on the workpiece 8 in which images having the shape of the object aperture are to be formed.

The screen lens 5 is formed of silicon, or aluminum (as a substrate) on which a metal (e.g. gold) which is not easily oxidized is deposited by vapor deposition, and has a number of lens apertures (e.g. circular apertures having a diameter of 1 mm) 5a formed therethrough. The screen lens projects images (e.g. rectangular images of a size of $1 \mu m \times 1 \mu m$) having the shape of the object aperture 3a through the respective lens apertures 5a on the workpiece 8 via the image forming electrode 6 and the acceleration/deceleration correcting lens 7. Thus a plurality of identical patterns can be written on the workpiece 8 at the same time.

The image forming electrode 6 is interposed between the screen lens 5 and the workpiece 8 for focusing ion beams having passed through the screen lens 5 at locations of apertures 6a (FIG. 6) in the image forming electrode 6. The acceleration/deceleration correcting lens 7 is interposed between the image forming electrode 6 and the workpiece 8 for focusing the ion beams 201 having passed through the image forming electrode 6 on the workpiece 8. The acceleration/deceleration correcting lens 7 corrects acceleration or deceleration of ion beams emerging from the image forming electrode 6 to thereby control divergency of the images formed at the latter. The image forming electrode 6 and the acceleration/deceleration correcting lens 7 will be described in detail hereinafter.

The X-Y stage 9 is a table driven by a stage driving motor 15 for movement in the directions of X axis and Y axis orthogonal to each other. The X-Y stage 9 moves the workpiece 8 placed thereon to predetermined positions for exposure. A distance measuring mirror 10 is provided on the X-Y stage 9, with which a laser measuring machine 14 cooperates to determine the position of the X-Y stage 9 with high accuracy.

The components 1 to 10 of the system described above are accommodated within a vacuum chamber 11 which is evacuated by a vacuum pumping system 12 to a predetermined pressure (e.g. $10^{-6}$ to $10^{-5}$ torr).

An ion beam source controller 16, a blanker controller 17, a beam deflection controller 18, a screen lens voltage controller 19, an image forming electrode voltage controller 20, an acceleration/deceleration correcting lens voltage controller 21, a bias voltage controller (bias voltage control means) 22, and a vacuum controller 23 are connected to the ion beam source 1, the blanker 2, the deflectors 4, the screen lens 5, the image forming electrodes 6, the acceleration/deceleration correcting lens 7, the workpiece 8, and the exhaust system 12 to control the ion beam source 1, the blanker 2, the deflectors 4, the screen lens 5, the image forimg electrodes 6, the acceleration/deceleration correcting lens 7, the bias voltage to be applied to the workpiece 8, and the vacuum pumping system 12, respectively.

The laser measuring machine 14 and the stage driving motor 15 are connected to a stage control system 13, which carries out detection of the position of the X-Y stage 9 and driving of same.

The above described controllers 16 to 23 and the stage control system 13 are connected to a control computer 25 via a CPU interface control circuit 24. The control computer 25 controls the overall operation of the exposure system. An input/output device 26 is also connected to the control computer 25 for inputting thereto pattern and control data, such as data of exposure position and bias voltage.

Figure 6:
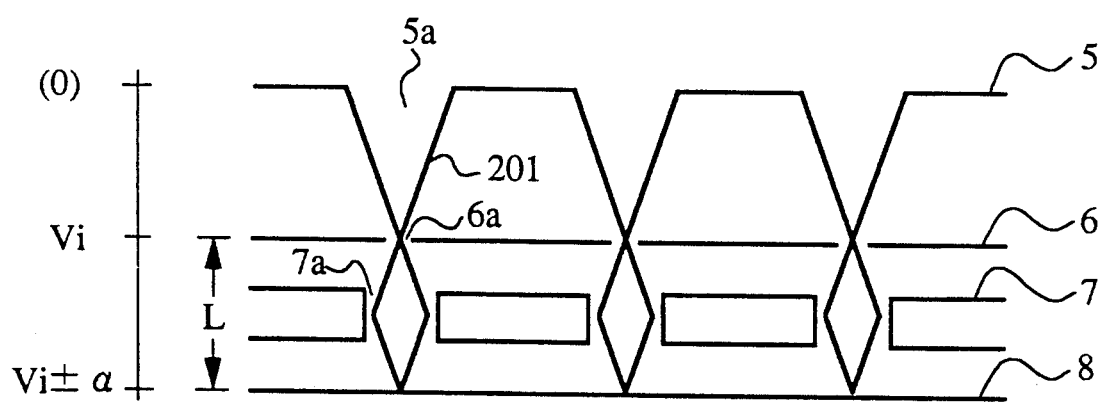
FIG. 6 is an enlarged schematic diagram showing essential parts of the system of FIG. 5.

FIG. 6 shows on an enlarged scale the screen lens 5, the image forming electrode 6, the acceleration/deceleration correcting lens 7, and the workpiece 8. The image forming electrode 6 has formed therethrough apertures 6a each having a smaller diameter than the lens apertures 5a of the screen lens 5 and formed at locations respectively corresponding thereto. The screen lens 5 is held at the same potential (ground level or a predetermined potential) as the object aperture plate 3, and a negative voltage Vi relative to the potential at the screen lens 5 is applies to the image forming electrode 6. Further, depending on the kind of processing (pattern writing, ion implantation, or vapor deposition), a bias voltage $\alpha$ relative to the potential at the image forming electrode 6 is applied to a major surface of the workpiece 8 by the bias voltage controller 22. The acceleration/deceleration correcting lens 7 has apertures 7a formed therethrough at locations respectively corresponding to the apertures 6a of the electrode 6. Applied to the acceleration/deceleration correcting lens 7 is a voltage calculated based on a distance L between the image forming electrode 5 and the workpiece 8 and the bias voltage a. In addition, the screen lens 5, the image forming electrode 6, the acceleration/deceleration correcting lens 7, and the workpiece 8 are arranged at such intervals that no electric discharge may occur between them.

By virtue of the above construction, according to the first embodiment of the invention, ion beams emerging from the screen lens 5 are focused at the respective apertures 6a of the image forming electrode 6, and diverge after passing through the apertures 6a, and then are again focused on the workpiece 8 by the acceleration/deceleration correcting lens 7.

As is learned from the above, the distance between the screen lens 5 and the workpiece 8 is increased as compared with the conventional system, to thereby provide the image forming electrode 6 and the acceleration/deceleration correcting lens 7 therebetween, and the bias voltage a to be applied to the workpiece 8 is adjusted in accordance with the kind of processing, whereby the energy of the ion beams to be irradiated on the workpiece 8 can be freely selected. Thus, it is possible to carry out pattern writing, ion implantation, vapor deposition, etc. by a single system. Further, it is possible to carry out processing with high resolution (with high position accuracy) since the focal locations of the ion beams can be accurately controlled to be on the workpiece 8 by the acceleration/deceleration correcting lens 7.

Figure 7:
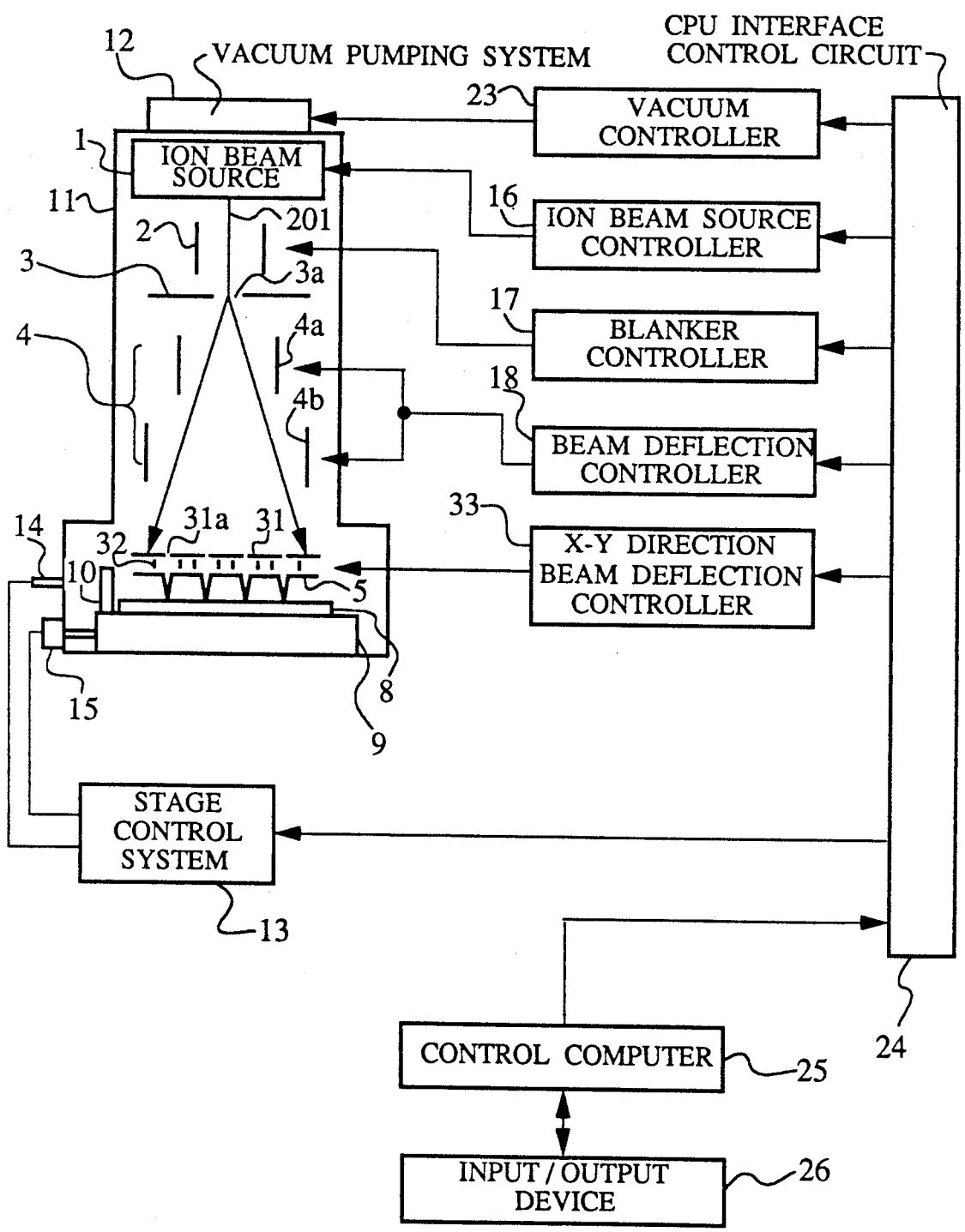
FIG. 7 is a schematic diagram showing the arrangement of a mutiple-imaging charged particle-beam exposure system according to a second embodiment of the invention.

FIG. 7 shows the arrangement of a multiple-imaging charged particle-beam exposure system according to a second embodiment of the invention. Identical reference numerals are used to designate corresponding identical components in FIG. 5. The following description will be limited to points which distinguish this embodiment from the first embodiment of FIG. 5 described above. Below the deflectors 4, there are arranged a beam limiting aperture plate 31, an X-Y deflector 32, and the screen lens 5, in the mentioned order. The ion beams emerging from the screen lens 5 are directly irradiated on the workpiece 8.

The beam limiting aperture plate 31 has a number of apertures 31a formed therethrough at locations corresponding respectively to the lens apertures 5a of the screen lens 5, and serve to limit the ion beams to be passed through the lens apertures of the screen lens. The beam limiting aperture plate 31 is formed of a material which is electrically conductive but nonmagnetic (e.g. stainless steel, tungsten, silicon, or molybdenum).

Figure 8:
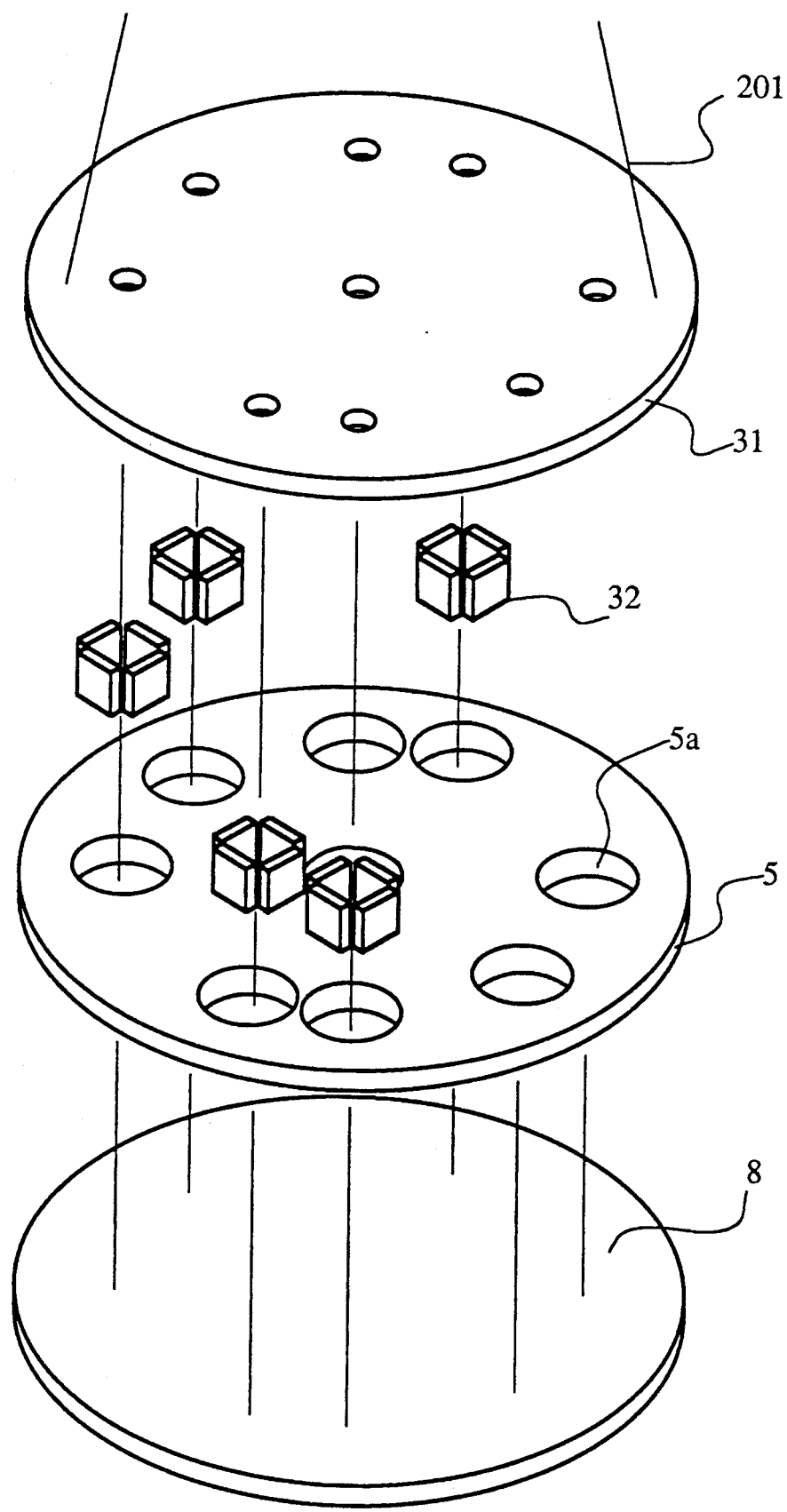
FIG. 8 is an enlarged perspective view of essential parts of the system of FIG. 7.

The X-Y deflector 32 comprises, as shown in FIG. 8, a number of deflectors corresponding in number to the number of the lens apertures 5a of the screen lens 5 for deflecting a plurality of ion beams emerging from the respective beam limiting apertures 31a (in FIG. 8, only part of the apertures are illustrated). Connected to the X-Y deflector 32 is an X-Y direction beam deflection controller 33, which is connected to the control computer 25 via the CPU interface control circuit 24, so that the X-Y deflector 32 is controlled by the X-Y direction beam deflection controller 33 in response to a control signal from the control computer 25.

Figure 9:
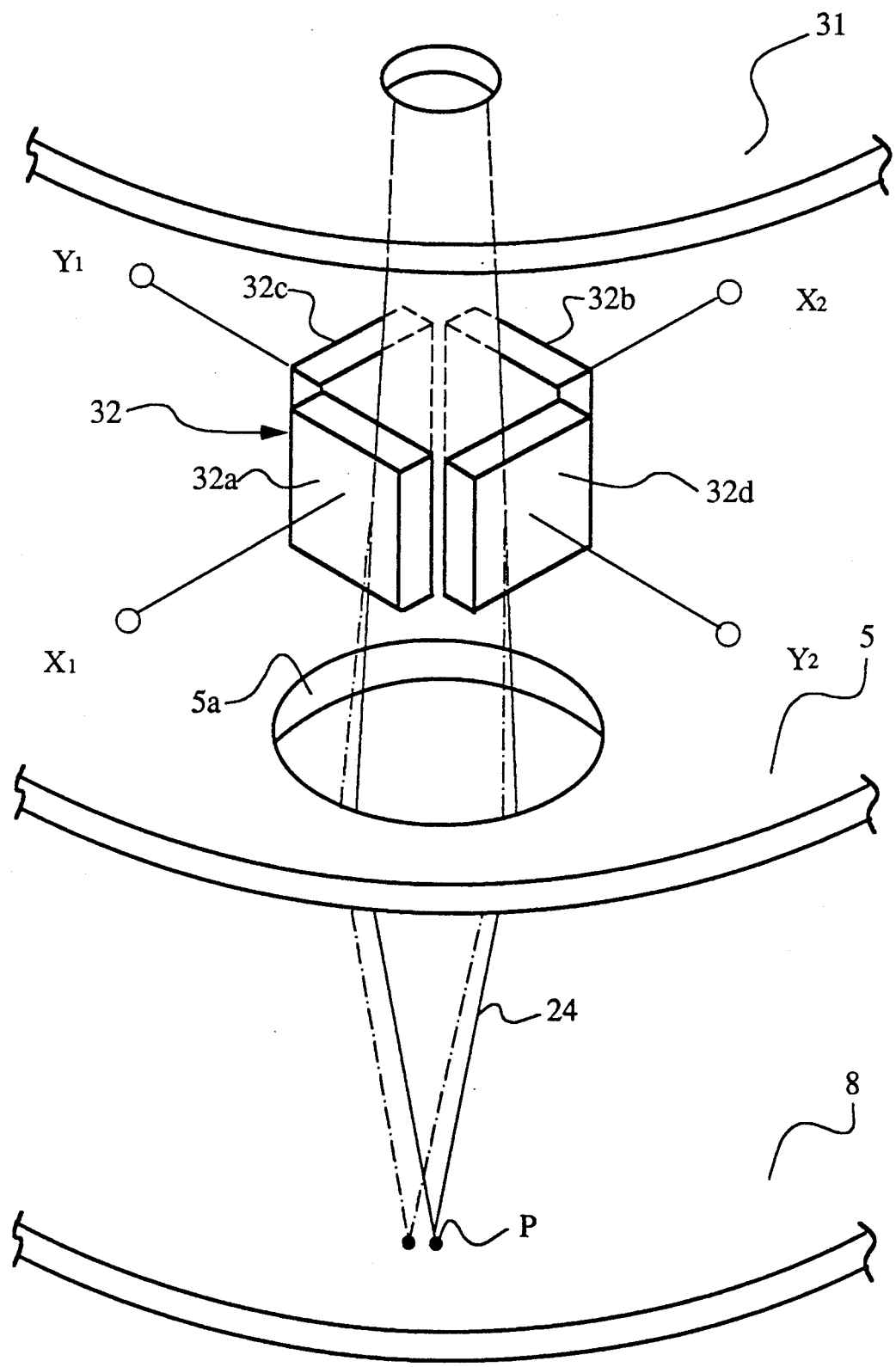
FIG. 9 is a schematic diagram useful in explaining the correction of a focal point by an X-Y deflector.

As shown in FIG. 9, each deflector of the X-Y deflector 32 is arranged in opposed relation to each corresponding lens aperture 5a of the screen lens 5, and is composed of two pairs of deflecting electrodes 32a and 32b, and 32c and 32d, the pair 32a, 32b being arranged in the X direction, and the pair 32c, 32d in the Y direction, respectively. By applying voltages between terminals $X_1$ and $X_2$, and between terminals $Y_1$ and $Y_2$, the ion beam emerging from the aperture 31 is deflected to correct a focal position P on the workpiece 8 where an image is formed (e.g. in the example of FIG. 9, the focal position of the ion beam shown by the one-dot chain line is shifted to one shown by the solid line). The maximum amount of shifting of the focal position P for correction thereof is approximately $\pm 1$ $\mu$m in the illustrated embodiment. The voltages between the paired electrodes can be set within a range of 50 to 200 V, depending on the diameter of the lens apertures 5a and a center-to-center distance between adjacent apertures 5a.

Figure 10:
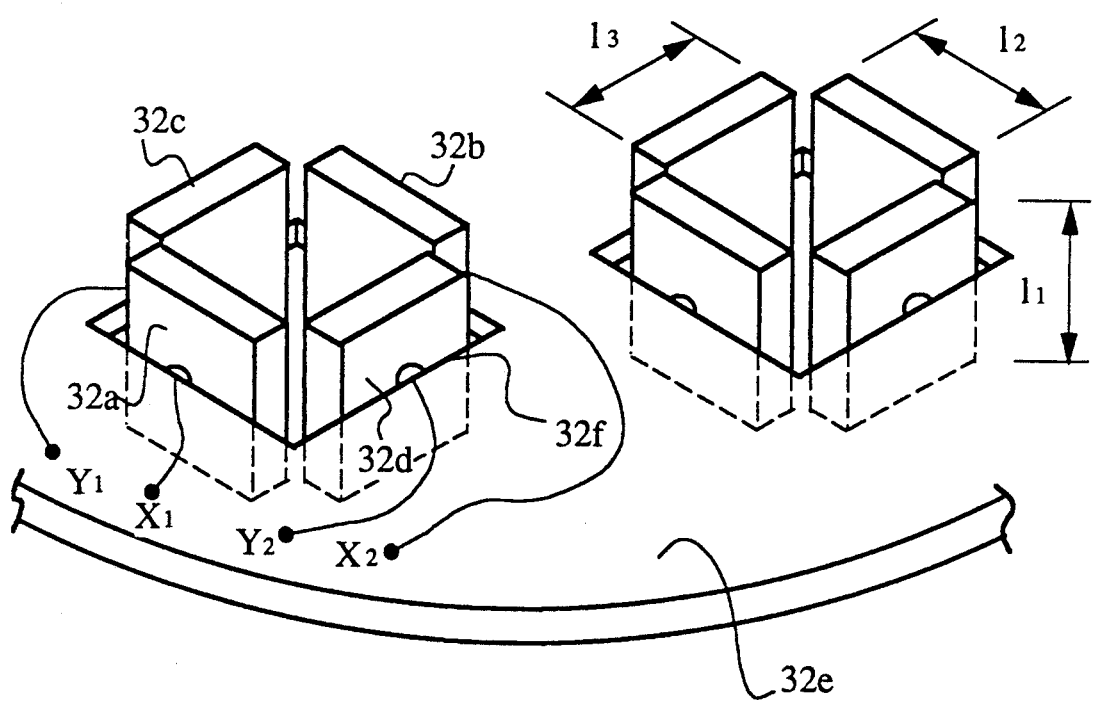
FIG. 10 is a schematic diagram showing an example of the arrangement of the X-Y deflector.

FIG. 10 shows a concrete example of the arrangement of the X-Y deflector 32. A disc 32e formed of an insulating material (e.g. silicon wafer coated with oxide) has rectangular holes 32f formed therethrough. Metallic deflecting electrodes 32a, 32b, 32c, and 32d are fixed to each of the rectangular holes 32f. The rectangular holes 32f are formed by exposure by photo-lithography and etching. The deflecting electrodes 32a, 32b, 32c, and 32d are connected by wires or a wiring pattern written by the photo-lithography to the terminals $X_1$, $X_2$, $Y_1$, and $Y_2$ formed (e.g. by the same lithography applied for forming the wiring pattern) in the periphery of the disc 32e. Further, the dimensions of each deflecting electrode, i.e. $l_1$, $l_2$, and $l_3$ in FIG. 10 are, e.g. approximately 2 to 3 mm.

The X-Y deflector 32 can correct the focal positions of a plurality of ion beams individually and independently of each other. Further, the X-Y deflector 32 is arranged above the screen lens 5 (more specifically between the beam limiting aperture plate 31 and the screen lens 5), so that the magnetic field between the screen lens 5 and the workpiece 8 is not disturbed. As a result, it is possible to prevent focal deviation of the charged particle beams and aberration or obscurity of images, which are liable to occur in the peripheral portion of the workpiece 8, and hence improve the writing accuracy as well as the production yield.

Figure 11:
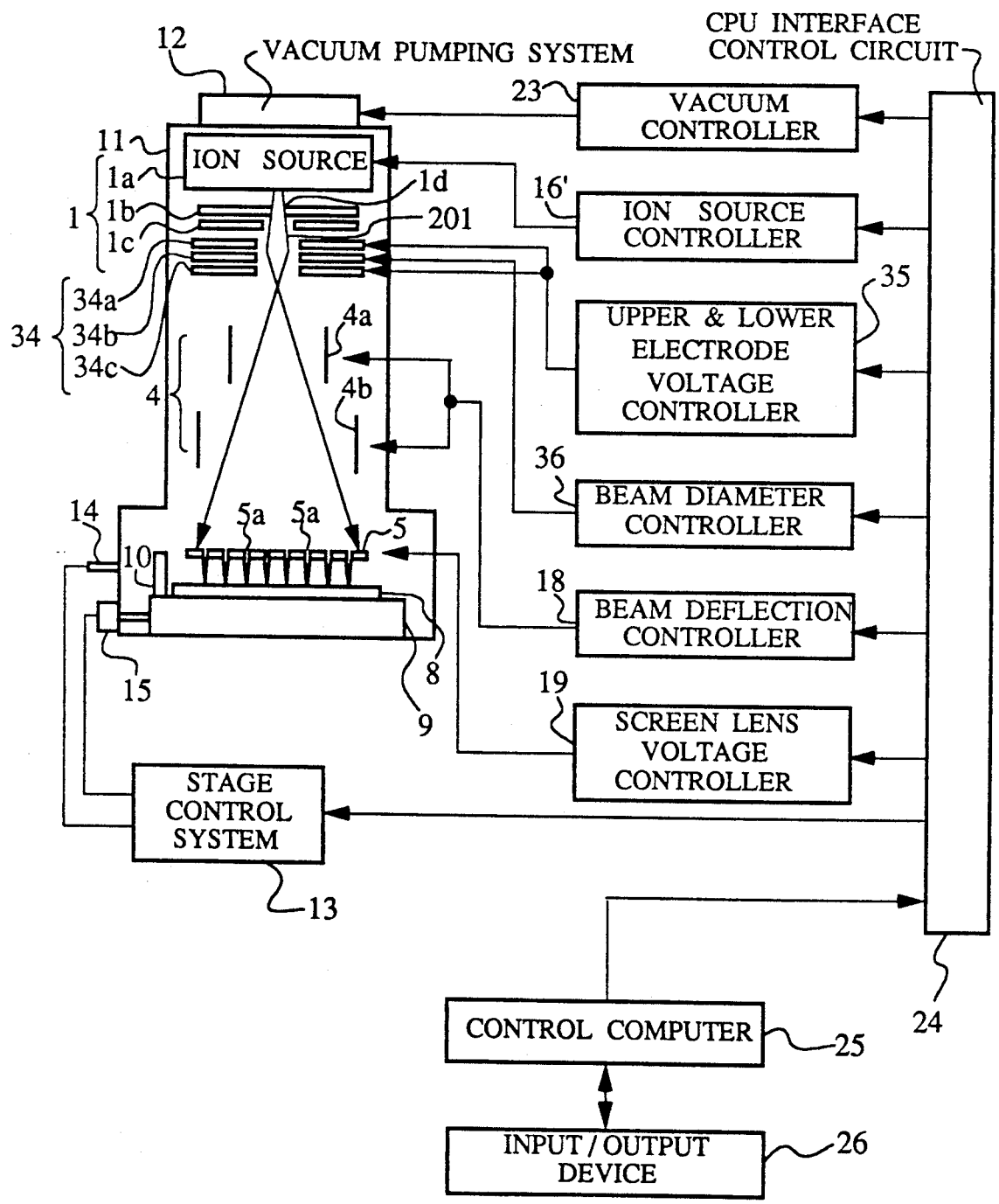
FIG. 11 is a schematic diagram showing the arrangement of a multiple-imaging charged particle-beam exposure system according to a third embodiment of the invention.

FIG. 11 shows the arrangement of a mulitple-imaging charged particle-beam exposure system according to a third embodiment of the invention. Identical reference numerals are used to designate correponding identical components in FIG. 5. The following description will be limited to points which distinguish this embodiment from the first embodiment shown in FIG. 5.

The ion beam source 1 is composed of an ion source 1a, a limiting aperture plate 1b, and a drawing electrode 1c. Below the ion beam source 1, there are arranged the Einzel lens 34, the deflectors 4, and the screen lens 5, in the mentioned order.

The cross-section of the ion beam 201 is shaped by a limiting aperture 1c formed through the limiting aperture plate 1b, and the ion beam 201 is accelerated by the drawing electrode 1d, and irradiated on the workpiece 8 on the X-Y stage 9 via the Einzel lens 34, the deflectors 4, and the screen lens 5. As a result, images having the shape of the limiting aperture 1d of the limiting aperture plate 1b are formed on the workpiece 8 in a number corresponding to the number of the lens apertures 5a of the screen lens 5, enabling a plurality of identical patterns to be written at the same time. Although the perimeter of the limiting aperture 1d of the limiting aperture plate 1b is exposed to irradiation of the ion beam, the limiting aperture plate 1b is damaged only to a slight degree since the limiting aperture plate 1b is located above the drawing electrode 1c so that the ion beam is in the course of acceleration and not fully accelerated.

The Einzel lens 34 is interposed between the limiting aperture 1c and the deflectors 4, and comprises an upper electrode 34a on a beam receiving side, a lower electrode 34c on a beam-emitting side, and an intermediate electrode 34b interposed between the upper and lower electrodes 34a, 34c. The Einzel lens 34 performs substantially the same function as that of the conventional object aperture provided immediately above the deflector.

The ion source 1a, the upper electrode 34a and the lower electrode 34c of the Einzel lens 34, and the intermediate electrode 34b of same are connected to an ion source controller 16', an upper and lower electrode voltage controller 35, and a beam diameter controller 36, respectively. These controllers 16', 35, and 36 control the ion source 1a, and the electrodes 34a, 34c, and 34b of the Einzel lens 34.

The controllers 6', 35, and 36 are connected to the control computer 25 via the CPU interface control circuit 24, to have their operations controlled by the control computer 25.

Figure 12:
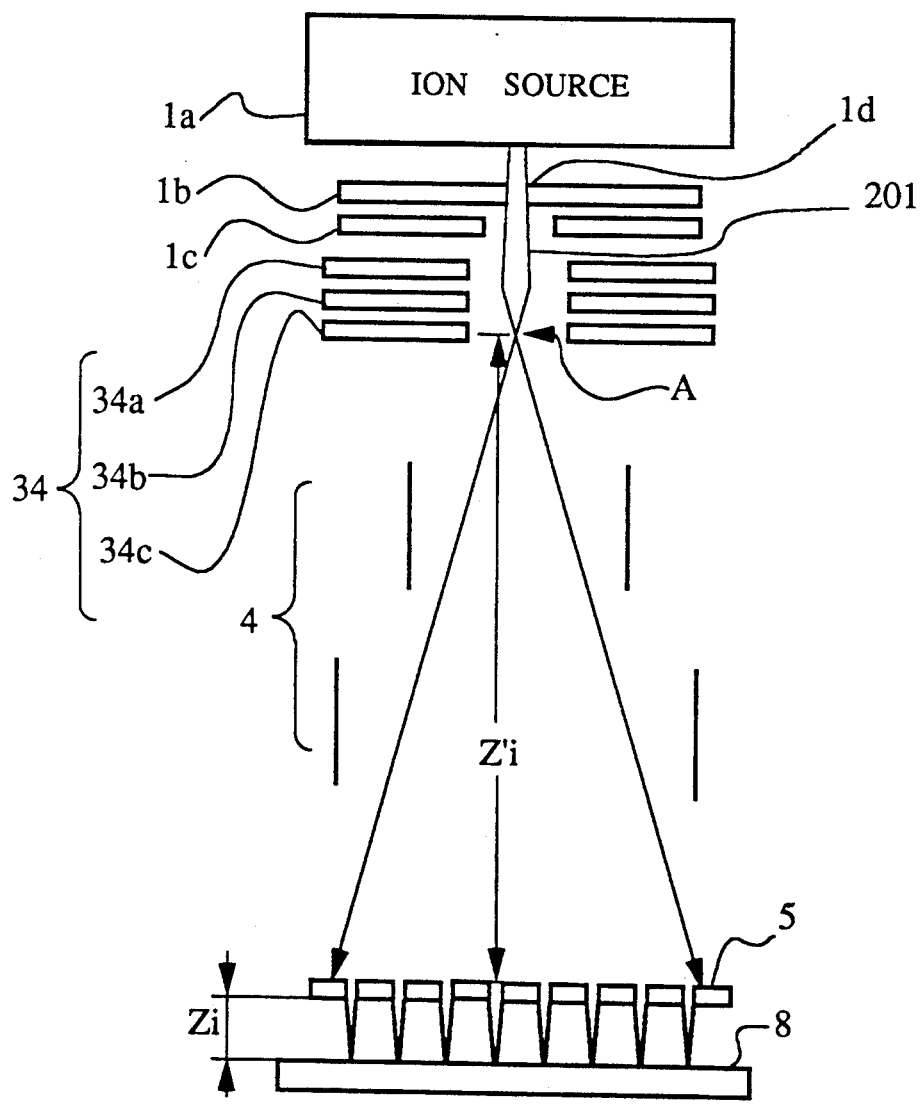
FIG. 12 is a schematic diagram showing essential parts of the system of FIG. 11.

The Einzel lens 34 is an electrostatic lens composed of three electrodes. The upper and lower electrodes 34a and 34b are held at the same potential, while the intermediate electrode 34b is held at a positive potential which can be adjusted to control the divergency of the ion beam passing through the Einzel lens, whereby the ion beam 201 is focused. Since the upper electrode 34a and the lower electrode 34c are at the same potential, the ion beam 201 is neither accelerated nor decelerated, and an image having the shape of the limiting aperture 1c is formed at a location between the electrodes 34a to 34c (a location indicated by A in FIG. 12). If a distance between the location A where the image is formed and the screen lens 5 is represented by Z'i (e.g. 1,000 mm), and a distance between the screen lens 5 and the workpiece 8 is represented by Zi (e.g. 20 mm), the magnification M of an image formed on the workpiece 8 is obtained by the following equation:

$$M = Zi/(2Z'i)$$

Figure 1:
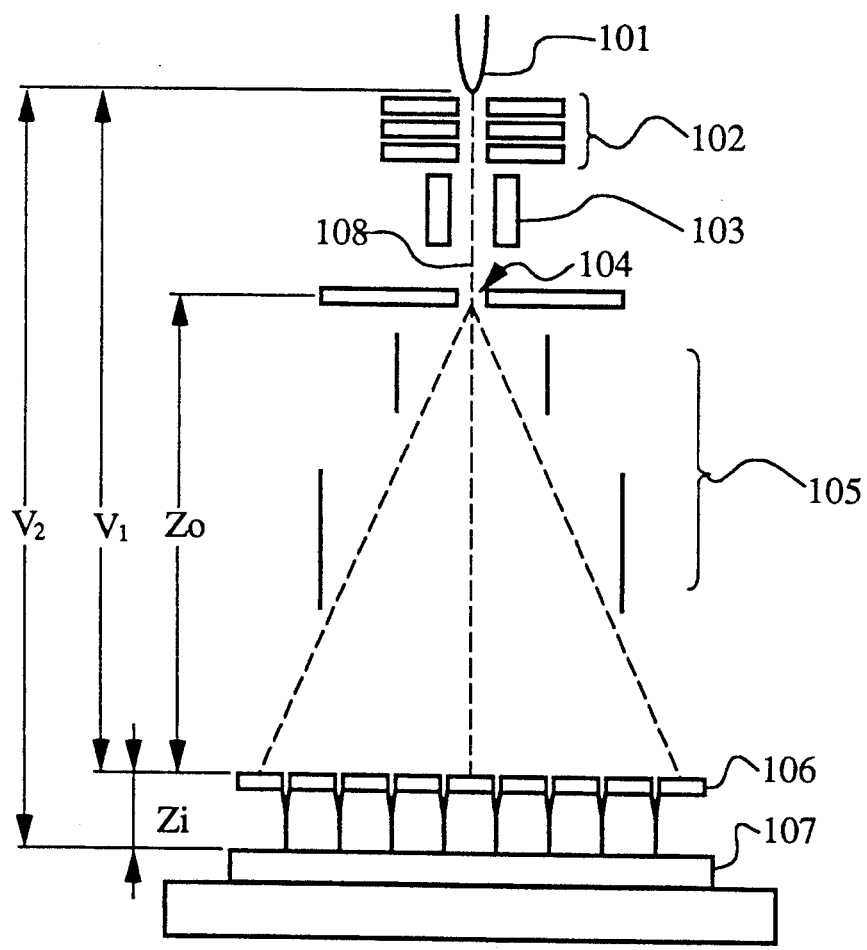
FIG. 1 is a schematic diagram showing the arrangement of a conventional multiple-imaging charged particle-beam exposure system.
Figure 2:
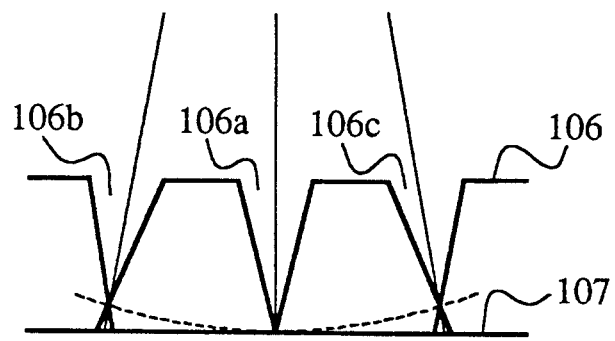
FIG. 2 is a schematic diagram useful in explaining a problem inherent to the system of FIG. 1.
Figure 3:
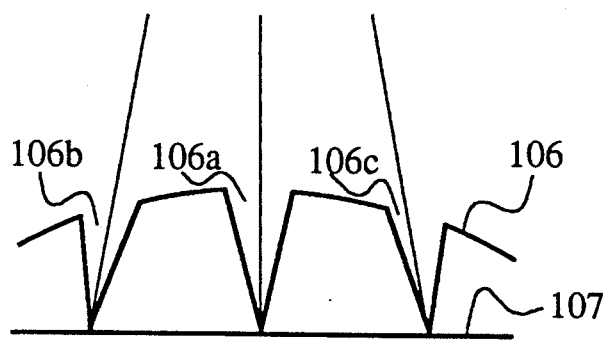
FIG. 3 is a schematic diagram showing conventionally proposed means for correcting focal locations where charged particle beams form images to solve the problem explained with reference to FIG. 2.
Figure 4:
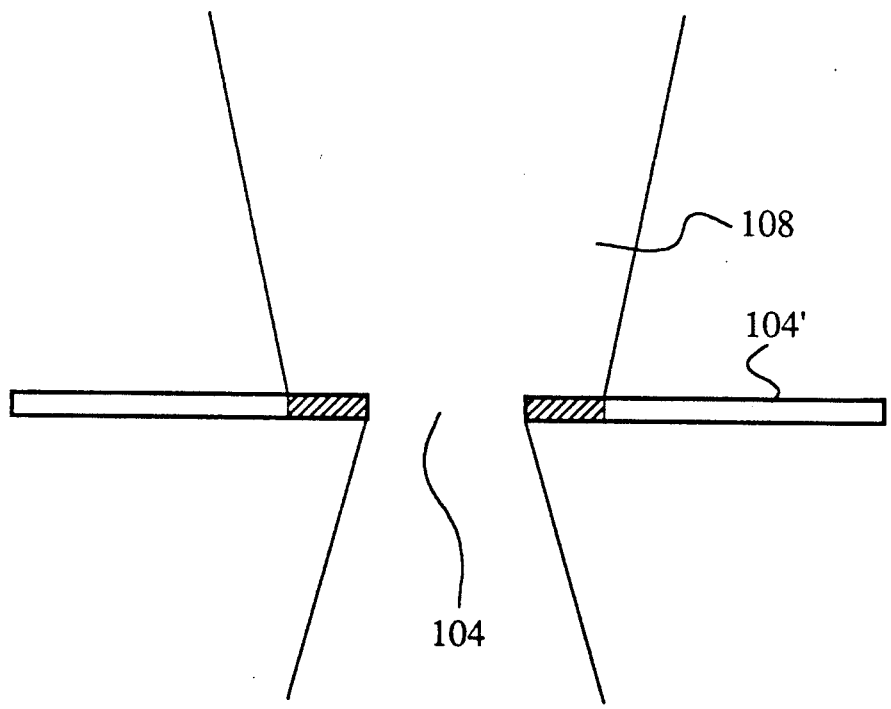
FIG. 4 is a schematic diagram showing the relationship between the beam and the object aperture.

The distance Z'i, i.e. the distance between the location A and the screen lens 5, corresponds to the distance between the object aperture 104 and the screen lens 106 of the conventional exposure system in FIG. 1.

Thus, the Einzel lens 34 performs substantially the same function as that of the object aperture (104 in FIG. 1) of the conventional exposure system, and is not damaged by the ion beam, enabling continuous longtime operation of the system. Further, since the energy of the ion beam is not lost, the writing area on the workpiece is not limited so that a wider writing area can be secured.

Figure 13A:
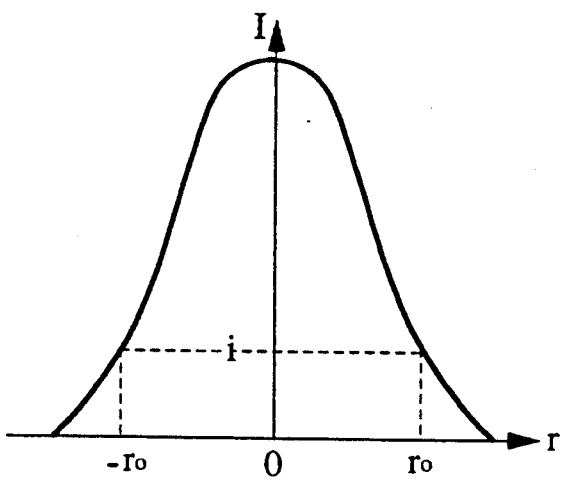
FIG. 13a is a diagram showing the current distribution of the beam.

FIG. 13a shows a current distribution of an image formed on the workpiece 8. In the figure, a point indicated by r=0 of the abscissa represents the optical axis of the ion beam (the center of the ion beam), and as the distance from the optical axis increases (as the absolute value of r increases), the current I diminishes. This is because the peripheral portion of the beam with smaller values of current I also reaches the workpiece 8 since the object aperture is not used.

Figure 13B:
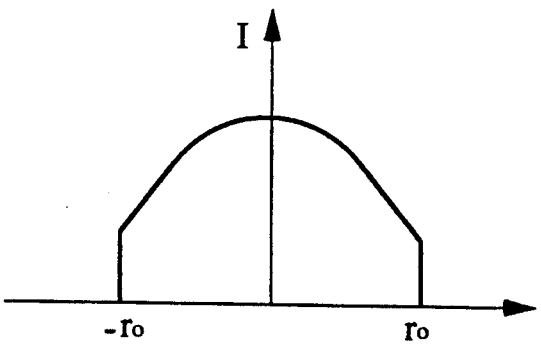
FIG. 13b is a diagram showing the state of exposure of a resist.

If a threshold value of current required for exposure of the resist on the workpiece 8 is represented by i, the current density of the ion beam, i.e. the writing area to be written by the ion beam, and the writing time, can be properly adjusted such that only the part (within a range of $\pm r_0$) which needs exposure, as shown by a possible pattern in FIG. 13b, is exposed to thereby prevent an obscure pattern from being written by the peripheral portion of the ion beam with smaller values of current.

What is claimed is:

1. In a multiple-imaging charged particle-beam exposure system including a charged particle beam source, a blanker for deflecting a charged particle beam emitted from said charged particle beam source, an object aperture for shaping the cross-section of the charged particle beam emerging from said blanker, deflector means for deflecting the charged particle beam emerging from said object aperture, and a screen lens having a number of lens apertures formed therethrough for dividing the charged particle beam deflected by said deflector into a plurality of beams, wherein exposure on an object to be exposed is effected, the improvement comprising:

image forming means interposed between said screen lens and said object for focusing charged particle beams emerging from said screen lens to form images at said image forming means;

acceleration/deceleration correcting means interposed between said image forming means and said object for controlling divergency of said images formed at said image forming means by correcting acceleration or deceleration of charged particle beams emerging from said image forming means, the charged particle beams emerging from said acceleration/deceleration correcting means forming images on said object; and bias voltage control means for applying a bias voltage relative to a potential at said image forming means to a surface of said object.

2. A multiple-imaging charged particle-beam exposure system according to claim 1, wherein said image forming means comprises an electrode which has apertures formed therethrough at locations corresponding respectively to said lens apertures of said screen lens, said apertures of said electrode each having a diameter smaller than that of said lens apertures of said screen lens, a negative voltage relative to said potential of said screen lens being applied to said electrode.

3. A multiple-imaging charged particle-beam exposure system according to claim 1, wherein said acceleration/deceleration correcting means comprises a lens to which is applied a voltage calculated based on a distance between said image forming means and said object, and said bias voltage.

4. A multiple-imaging charged particle-beam exposure system according to claim 2, wherein said acceleration/deceleration correcting means comprises a lens to which is applied a voltage calculated based on a distance between said image forming means and said object, and said bias voltage.

5. In a multiple-imaging charged particle-beam exposure system including a charged particle beam source, a blanker for deflecting a charged particle beam emitted from said charged particle beam source, an object aperture for shaping the cross-section of the charged particle beam emerging from said blanker, first deflector means for deflecting the charged particle beam emerging from said object aperture, and a screen lens having a number of lens apertures formed therethrough for receiving the charged particle beam deflected by said first deflector so that a beam emerging from each of said lens apertures of said screen lens forms an image on an object to be exposed, wherein exposure on said object is effected, the improvement comprising:

beam limiting means interposed between said first deflector means and said screen lens, said beam limiting means having a plurality of beam limiting apertures formed therethrough; and second deflector means interposed between said beam limiting means and said screen lens for individually deflecting a plurality of charged particle beams emerging from said beam limiting apertures.

6. A multiple-imaging charged particle-beam exposure system according to claim 5, wherein said deflector means deflects said charged particle beams in two directions orthogonal to each other.

7. A multiple-imaging charged particle-beam exposure system according to claim 4, wherein said deflector means comprises two pairs of electrodes arranged at a location corresponding to each of said lens apertures of said screen lens, voltages being applied to said two pairs of electrodes, said voltage being controlled independently of each other.

8. In a multiple-imaging charged particle-beam exposure system including a charged particle beam source, and a screen lens having a number of lens apertures formed therethrough, wherein a charged particle beam is emitted from said charged particle beam source so that a beam emerging from each of said lens apertures of said screen lens is irradiated on an object to be exposed, to effect exposure on said object, the improvement comprising:

a member having a limiting aperture for shaping said charged particle beam emitted from said charged particle beam source;

a drawing electrode for taking out said charged particle beam via said member having said limiting aperture;

a deflector for deflecting said charged particle beam; and an Einzel lens interposed between said drawing electrode and said deflector, the distance between a focal point of said Einzel lens and said screen lens being set in response to the distance between said screen lens and said object as well as to a desired magnification of an image formed on said object.

9. A multiple-imaging charged particle-beam exposure system according to claim 8, wherein said Einzel lens comprises an upper electrode located on a beam-receiving side thereof, a lower electrode located on a beam-emitting side thereof, and an intermediate electrode interposed between said upper electrode and said lower electrode, said upper electrode and said lower electrode having the same electric potential, said intermediate electrode having a potential adjustable for controlling divergency of said charged particle beam passing therethrough.

10. A multiple-imaging charged particle-beam exposure system according to claim 9, wherein said potential of said intermediate electrode is set to a value higher than said potential of said upper and lower electrodes.

11. In a multiple-imaging charged particle-beam exposure system including a charged particle beam source, and a screen lens having a number of lens apertures formed therethrough, wherein a charged particle beam is emitted from said charged particle beam source so that a beam emerging from each of said lens apertures of said screen lens is irradiated on an object to be exposed, to effect exposure on said object, the improvement comprising:

image forming means interposed between said screen lens and said object for focusing ion beams emerging from said screen lens to form images at said image forming means;

acceleration/deceleration correcting means interposed between said image forming means and said object for controlling divergency of said images formed at said image forming means by correcting acceleration or deceleration of ion beams emerging from said image forming means; and bias voltage control means for applying a bias voltage relative to a potential at said image forming means to a surface of said object; and said image forming means comprising an electrode which has apertures formed therethrough at locations corresponding respectively to said lens apertures of said screen lens, said apertures of said electrode each having a diameter smaller than that of said lens apertures of said screen lens, a negative voltage relative to said potential of said screen lens being applied to said electrode.

12. A multiple-imaging charged particle-beam exposure system according to claim 11, wherein said acceleration/deceleration correcting means comprising a lens to which is applied a voltage calculated based on a distance between said image forming means and said object, and said bias voltage.

13. In a multiple-imaging charged particle-beam exposure system including a charged particle beam source, and a screen lens having a number of lens apertures formed therethrough, wherein a charged particle beam is emitted from said charged particle beam source so that a beam emerging from each of said lens apertures of said screen lens is irradiated on an object to be exposed, to effect exposure on said object, the improvement comprising:

image forming means interposed between said screen lens and said object for focusing ion beams emerging from said screen lens to form images at said image forming means;

acceleration/deceleration correcting means interposed between said image forming means and said object for controlling divergency of said images formed at said image forming means by correcting acceleration or deceleration of ion beams emerging from said image forming means; and bias voltage control means for applying a bias voltage relative to a potential at said image forming means to a surface of said object; and said acceleration/deceleration correcting means comprising a lens to which is applied a voltage calculated based on a distance between said image forming means and said object, and said bias voltage.

* * * * *